US006885341B2

(12) United States Patent
Tran et al.

(10) Patent No.: US 6,885,341 B2
(45) Date of Patent: Apr. 26, 2005

(54) INVERTED-F FERROELECTRIC ANTENNA

(75) Inventors: Allen Tran, San Diego, CA (US); Jordi Fabrega-Sanchez, San Diego, CA (US)

(73) Assignee: Kyocera Wireless Corporation, San Diego, CA (US)

( * ) Notice: Subject to any disclaimer, the term of this patent is extended or adjusted under 35 U.S.C. 154(b) by 236 days.

(21) Appl. No.: 10/120,603

(22) Filed: Apr. 9, 2002

(65) Prior Publication Data

US 2002/0149526 A1 Oct. 17, 2002

Related U.S. Application Data

(60) Provisional application No. 60/283,093, filed on Apr. 11, 2001.

(51) Int. Cl.[7] ................................................. H01Q 1/36
(52) U.S. Cl. ................................. 343/700 MS; 343/702
(58) Field of Search ......................... 343/702, 700 MS, 343/745, 909

(56) References Cited

U.S. PATENT DOCUMENTS 5,231,407 A * 7/1993 McGirr et al. ....... 343/700 MS
5,764,190 A * 6/1998 Murch et al. ............... 343/702
5,966,097 A * 10/1999 Fukasawa et al. ... 343/700 MS

* cited by examiner

Primary Examiner—Michael C. Wimer

(57) ABSTRACT

An inverted-F ferroelectric antenna is provided. The antenna comprises a counterpoise, or groundplane, and an inverted-F structure radiator having a first end connected to the counterpoise. A fixed dielectric material, typically a ceramic or air separates the radiator and the counterpoise. A capacitor, formed from a ferroelectric dielectric is connected between the second end of the radiator and the counterpoise. The capacitor has a variable dielectric constant, and the antenna is resonant at a frequency responsive to the dielectric constant of the capacitor ferroelectric material. Typically, the capacitor includes a dielectric formed from a fixed constant dielectric, together with a ferroelectric dielectric with a variable dielectric constant. A bias voltage feed is used to apply a voltage to the capacitor ferroelectric dielectric. The ferroelectric dielectric has a dielectric constant that varies in response to the applied voltage. In one aspect of the antenna, the capacitor has a capacitance of approximately 0.35 picofarads (pF) at zero volts of bias voltage and a capacitance of approximately 0.29 pf at 40 volts of bias voltage.

35 Claims, 5 Drawing Sheets

INVERTED-F FERROELECTRIC ANTENNA

RELATED APPLICATIONS

This application claims the benefit of U.S. Provisional Application 60/283,093, filed Apr. 11, 2001, which is hereby incorporated by reference. In addition, this application relates to the following U.S. applications, which are hereby incorporated by reference: Ser. No. 09/904,631 filed on Jul. 13, 2001, by Stanley S. Toncich entitled "Ferro-Electric Tunable Filter"; Ser. No. 09/912,753 filed on Jul. 24, 2001 by Stanley S. Toncich entitled "Tunable Ferro-Electric Multiplexer"; Ser. No. 09/927,732 filed on Aug. 8, 2001, by Stanley S. Toncich entitled "Low Loss Tunable Ferro-Electric Device and Method of Characterization"; Ser. No. 09/927,136 filed on Aug. 10, 2001, by Stanley S. Toncich entitled "Tunable Matching Circuit"; Ser. No. 10/044,522 filed on Jan. 11, 2002, by Stanley S. Toncich entitled "Tunable Planar Capacitor"; Ser. No. 10/077,654 filed on Feb. 14, 2002, by Stanley S. Toncich entitled "Tunable Isolator Matching Circuit"; Ser. No. 10/076,171 filed on Feb. 12, 2002, by Stanley S. Toncich entitled "Antenna Interface Unit"; Ser. No. 10/075,896 filed Feb. 12, 2002, by Stanley S. Toncich entitled "Tunable Antenna Matching Circuit"; Ser. No. 10/075,727 filed Feb. 12, 2002, by Stanley S. Toncich and Tim Forrester entitled "Tunable Low Noise Amplifier"; Ser. No. 10/075,507 filed on Feb. 12, 2002, by Stanley S. Toncich entitled "Tunable Power Amplifier Matching Circuit"; and "Ferroelectric Antenna and Method for Tuning Same", filed Apr. 4, 2002 by Stanley S. Toncich and Allen Tran.

BACKGROUND OF THE INVENTION

1. Field of the Invention

This invention generally relates to wireless communication antennas and, more particularly, to an invented-F antenna that is tuned using a ferroelectric capacitor.

2. Description of the Related Art

There are several types of conventional antenna designs that incorporate the use of a dielectric material. Generally speaking, a portion of the field that is generated by the antenna returns to the counterpoise (ground), from the radiator, through the dielectric. The antenna is tuned to be resonant at frequencies, and the wavelengths of the radiator and dielectrics have an optimal relationship at the resonant frequency. The most common dielectric is air, with a dielectric constant of 1. The dielectric constants of other materials are defined with respect to air.

Ferroelectric materials have a dielectric constant that changes in response to an applied voltage. Because of their variable dielectric constant, ferroelectric materials are good candidates for making tunable components. Under presently used measurement and characterization techniques, however, tunable ferroelectric components have gained the reputation of being consistently and substantially lossy, regardless of the processing, doping or other fabrication techniques used to improve their loss properties. They have therefore not been widely used. Ferroelectric tunable components operating in RF or microwave regions are perceived as being particularly lossy. This observation is supported by experience in Radar applications where, for example, high radio frequency (RF) or microwave loss is the conventional rule for bulk (thickness greater than about 1.0 mm) FE (ferroelectric) materials especially when maximum tuning is desired. In general, most FE materials are lossy unless steps are taken to improve (reduce) their loss. Such steps include, but are not limited to: (1) pre and post deposition annealing or both to compensate for O2 vacancies, (2) use of buffer layers to reduce surfaces stresses, (3) alloying or buffering with other materials and (4) selective doping.

As demand for limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss. In wireless communications, for example, a Q of greater than 80, and preferably greater than 180 and, more preferably, greater than 350, is necessary at frequencies of about 2 GHz. These same assumptions apply to the design of antennas.

Tunable ferroelectric components, especially those using thin films, can be employed in a wide variety of frequency agile circuits. Tunable components are desirable because they can provide smaller component size and height, lower insertion loss or better rejection for the same insertion loss, lower cost and the ability to tune over more than one frequency band. The ability of a tunable component that can cover multiple bands potentially reduces the number of necessary components, such as switches that would be necessary to select between discrete bands were multiple fixed frequency components used. These advantages are particularly important in wireless handset design, where the need for increased functionality and lower cost and size are seemingly contradictory requirements. With code division multiple access (CDMA) handsets, for example, performance of individual components is highly stressed. Ferroelectric (FE) materials may also permit integration of RF components that to-date have resisted shrinkage, such as an antenna interface unit (AIU) for a wireless device.

It is known to use a so-called inverted-F antenna design in the fabrication of portable wireless communication devices. The inverted-F design permits an antenna to be made in a relatively small package. Many conventional wireless devices operate in several frequency bands. Even if each antenna is small, the total amount of space required for several antennas (one for each frequency band) can be prohibitive.

It would be advantageous if a single antenna could be used for portable wireless communications in a plurality of frequency bands.

It would be advantageous if an inverted-F antenna could be made tunable to operate over a plurality of frequency bands.

It would be advantageous if ferroelectric material could be used in tuning an inverted-F antenna.

SUMMARY OF THE INVENTION

The present invention describes an inverted-F antenna that is tuned to operate over a plurality of frequency bands by using a ferroelectric material as a dielectric. More specifically, a FE capacitor is used to modify the electrical length of the inverted-F radiator.

Accordingly, an inverted-F ferroelectric antenna is provided. The antenna comprises a counterpoise, or groundplane, and an inverted-F structure radiator having a first end connected to the counterpoise. A fixed constant dielectric material, typically a ceramic or air separates the radiator and the counterpoise. A capacitor, formed from a dielectric with ferroelectric material, is connected between the second end of the radiator and the counterpoise. The capacitor has a variable dielectric constant, and the antenna is resonant at a frequency responsive to the dielectric constant of the capacitor ferroelectric material.

Typically, the capacitor includes a dielectric formed from a material with a fixed dielectric constant, together with the FE dielectric having the variable dielectric constant. A bias voltage feed is used to apply a voltage to the capacitor FE dielectric. The dielectric with ferroelectric material has a dielectric constant that varies in response to the applied voltage. In one aspect of the antenna, the capacitor has a capacitance of approximately 0.35 picofarads (pF) at zero volts of bias voltage and a capacitance of approximately 0.29 pf at 40 volts of bias voltage.

Additional details of the above-described inverted-F ferroelectric antenna are provided below.

DETAILED DESCRIPTION OF THE PREFERRED EMBODIMENTS

Figure 1:
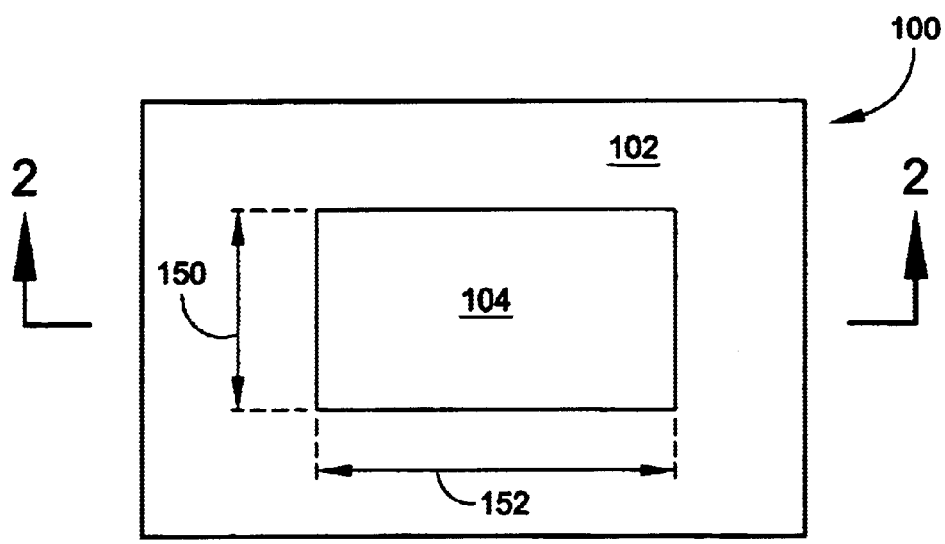
FIG. 1 is a plan view of the present invention inverted-F ferroelectric antenna.

FIG. 1 is a plan view of the present invention inverted-F ferroelectric antenna. The antenna 100 comprises a counterpoise 102 in a first plane and an inverted-F structure radiator 104 overlying the counterpoise 102 in a second plane. The inverted-F antenna is a type of patch antenna.

Figure 2:
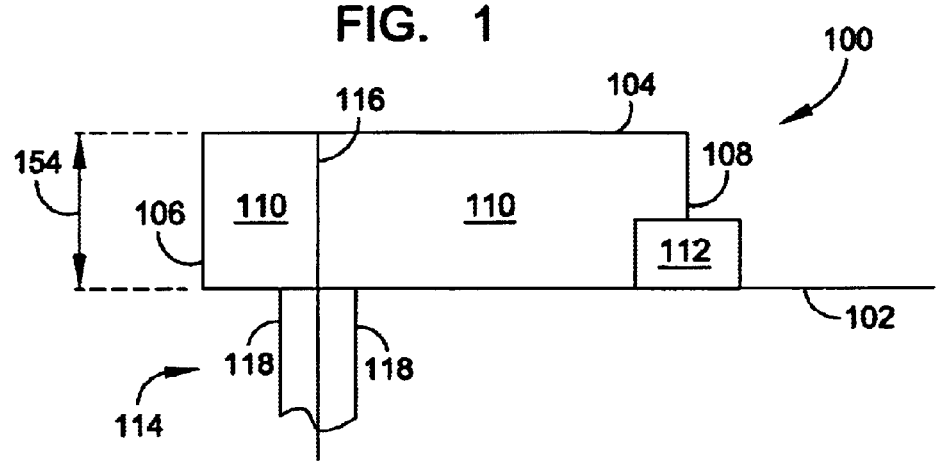
FIG. 2 is a partial cross-sectional view of the antenna of FIG. 1.

FIG. 2 is a partial cross-sectional view of the antenna of FIG. 1. The radiator 104 has a first end 106 connected to the counterpoise 102 and a second end 108. A first dielectric 110 is interposed between the radiator 104 and the counterpoise 102. Typically, the first dielectric is air or a ceramic material, such as Alumina. However, FR4, foam, MgO, lanthanum aluminate, and sapphire can also be used. The present invention antenna is not limited to just this list of materials, as there are many conventional dielectric materials that are practical.

A first capacitor 112 is formed from a dielectric with ferroelectric material, having a variable dielectric constant, interposed between the radiator second end 108 and the counterpoise 102. The antenna 100 is resonant at a frequency responsive to the dielectric constant of the first capacitor 112 ferroelectric material. The combination of the first capacitor 112 and the radiator 104 have an effective electrical wavelength of a quarter-wavelength of the resonant frequency.

A radio frequency (RF) antenna interface 114 connects the radiator 104 to a transmission line first polarity 116 and connects the counterpoise 102 to the transmission line second polarity 118. The antenna interface 114 has a predetermined fixed characteristic impedance independent of the resonant frequency. Typically, the antenna interface 114 is designed to be 50 ohms with a voltage standing wave ration (VSWR) or less than 2:1 at the operating frequency. Alternately stated, the antenna interface has a return loss of greater than approximately 10 decibels (dB). The antenna interface 114 can be designed to interface with a microstrip, stripline, coaxial, or any convention transmission line.

The antenna 100 has a predetermined approximately constant gain independent of the resonant frequency. In some aspects, the first capacitor is used to make relatively large shifts in antenna operating frequency, between frequency bands. Alternately, the first capacitor is used to shift between narrow channels frequencies within the same frequency band.

In some aspects, the first capacitor includes a dielectric formed exclusively from a ferroelectric material with a variable dielectric constant. That is, the capacitor is made with only FE dielectric material, so that changes in dielectric constant, and therefore capacitance, result from bias voltage changes. The first capacitor FE dielectric can have a dielectric constant in the range between 100 and 5000 at zero volts.

In other aspects, the dielectric constant of ferroelectric materials is too high. Then, the first capacitor 112 is typically formed from an additional dielectric, a material with a fixed dielectric constant (fixed constant dielectric). The material can be a ceramic, FR4, air, foam, MgO, lanthanum aluminate, or sapphire, to name a few examples. Many other conventional fixed dielectric materials are also practical. Therefore, first capacitor includes a dielectric formed from a ferroelectric material (ferroelectric dielectric) with a variable dielectric constant, together with a fixed constant dielectric material.

However, the composite dielectric constant resulting from the first capacitor being formed from a fixed constant dielectric material, as well as the ferroelectric dielectric, is in the range between 2 and 100 at zero volts.

Typically, first capacitor FE dielectric material is formed from barium strontium titanate, $Ba_xSr_{1-x}TiO_3$ (BSTO). The BSTO ferroelectric material may include oxide dopants of tungsten, manganese, or magnesium. Depending upon the FE material dielectric constant and the FE material thickness, first capacitor can be fabricated with a FE dielectric having a dielectric constant that doubles in response to a change of less than 1 volt of bias voltage.

In some aspects, the antenna can be tuned to operate at PCS frequencies in the range from 1850 to 1990 megahertz (MHz). Then, the radiator has a width 150 (see FIG. 1) of 5.9 millimeters (mm) and a length 152 of 16 mm. The radiator has a height 154 (see FIG. 2) of 6.5 mm. In this example, the first dielectric 110 is air and the first capacitor 112 has a capacitance of approximately 0.35 picofarads (pF) at zero volts of bias voltage. At 40 volts of bias voltage, the first capacitor 112 has a capacitance of approximately 0.29 pf.

More generally, the first capacitor 112 can be fabricated to have a capacitance in the range of 0.1 to 10 pf at zero volts, although the first capacitor is not necessarily limited to this range. Other practically obtainable frequency bands are 824 to 894 MHz and 1565 to 1585 MHz.

In some aspects, the first capacitor FE dielectric is formed in a thin film having a thickness in the range from 0.15 to 2 microns. In other aspects, the FE dielectric is formed in a thick film having a thickness in the range from 1.5 to 1000 microns.

Figure 3:
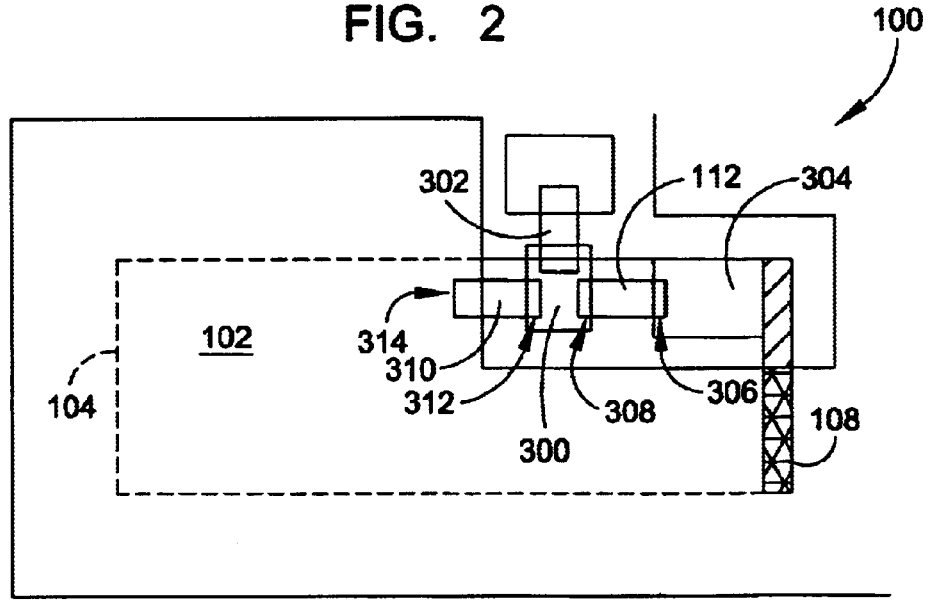
FIG. 3 is a plan view of the antenna of FIG. 1 showing components underlying the radiator.

FIG. 3 is a plan view of the antenna of FIG. 1 showing components underlying the radiator 104. A bias voltage feed 300 applies a voltage to the first capacitor 112 with the ferroelectric material. A resistor 302 is used to supply voltage (current) to the voltage feed 300, and the voltage feed 300 supplies voltage (current) to the first capacitor 112. Additional filtering may also be connected to the voltage feed 300 to shunt RF signal to ground. The other end of the first capacitor 112 is connected to a pad 304, and connected in turn to the radiator second end 108, in the area of hatched lines. Note that the radiator second end 108 is not connected to the underlying counterpoise 102, in the area of cross-hatched lines. An air gap or solid dielectric spacer separates the radiator second end 108 from the underlying counterpoise 102. Since the radiator is typically a dc ground, a dc voltage is developed across the first FE capacitor 112. The FE dielectric has a dielectric constant that varies in response to the applied voltage.

The first capacitor 112 has a first terminal 306 connected to the radiator second end 118 and a second terminal 308 connected to the voltage feed 300. The bias voltage feed 300 applies a first voltage potential across the first capacitor 112.

Figure 4A:
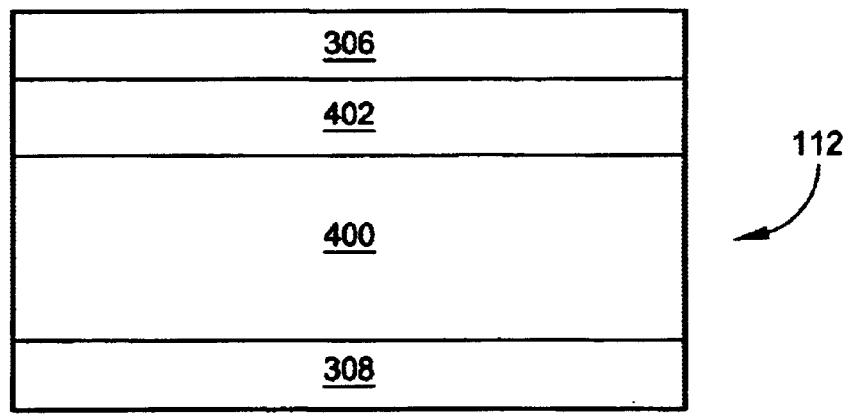
FIGS. 4a, 4b, 4c, and 4d illustrate the first capacitor embodied as parallel plate and gap capacitors.

FIGS. 4a, 4b, 4c, and 4d illustrate the first capacitor 112 embodied as parallel plate and gap capacitors. As seen in FIG. 4a, the first capacitor 112 is a parallel plate capacitor having the first terminal 306 formed as a plate, overlying a layer of FE dielectric 402, overlying a layer of fixed constant dielectric 400, overlying the second terminal 308 formed as a plate.

Figure 4B:
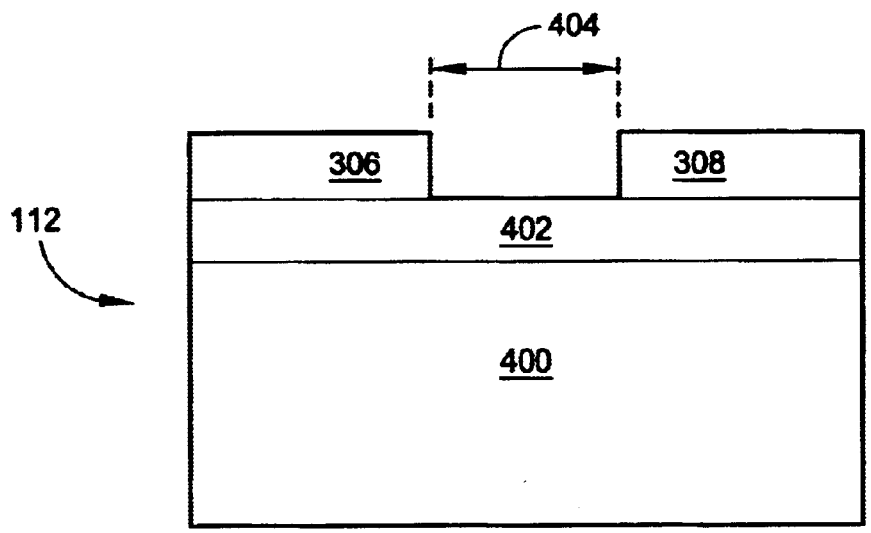

As seen in FIG. 4b, the first capacitor 112 is a gap capacitor having the first and second terminals 306/308 formed as pads, separated by a gap 404, overlying a layer of FE dielectric 402. The layer of FE dielectric 402 overlies a layer of fixed constant dielectric 400.

Alternately stated, the first capacitor 112 includes at least one fixed constant dielectric layer 400 and a FE dielectric 402, having a variable dielectric constant, adjacent the fixed constant dielectric 400. There are a variety of other approaches, not specifically shown, that can be used to combine regions of FE dielectric with regions of fixed constant dielectric material to provide the desired composite dielectric constant.

As seen in FIG. 4b the ferroelectric dielectric 402 can be interposed between the fixed constant dielectric 400 and the terminals 306/308. Alternately but not shown, the fixed constant dielectric is interposed between the FE dielectric and the terminals.

Figure 4C:
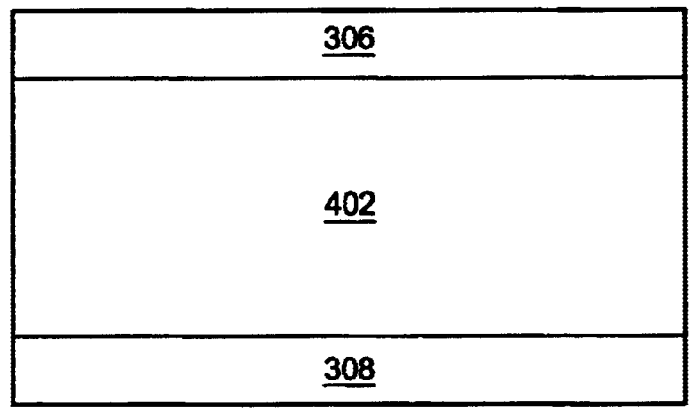

FIG. 4c illustrates a first parallel plate capacitor 112 where the dielectric is formed exclusively from a ferroelectric material.

Figure 4D:
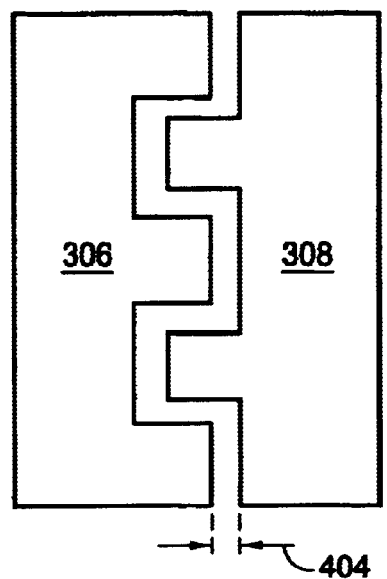

FIG. 4d is a plan view an interdigital variation of the first gap capacitor 112.

Figure 5A:
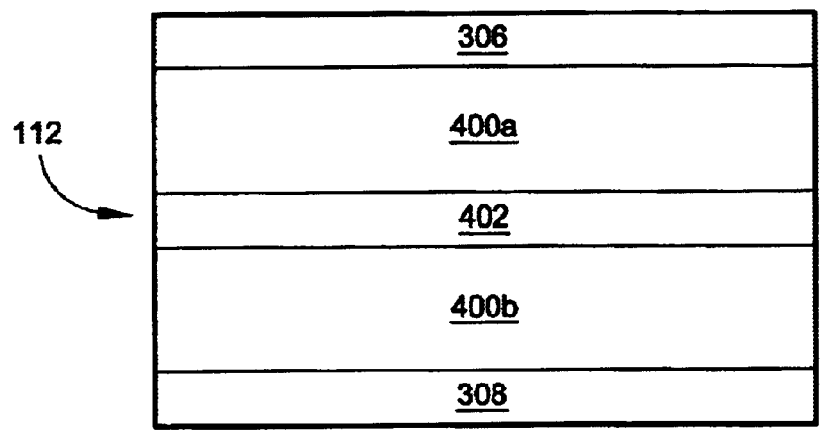
FIGS. 5a and 5b illustrate different aspects of the first capacitor of FIGS. 4a and 4b, respectively.
Figure 5B:
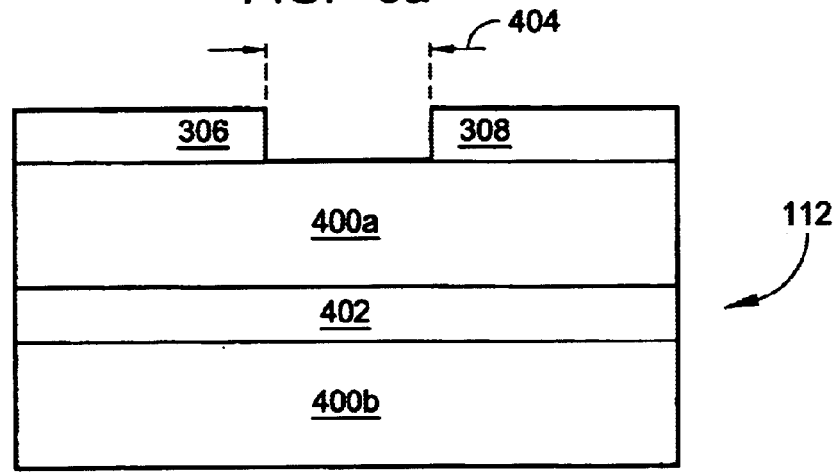

FIGS. 5a and 5b illustrate different aspects of the first capacitor 112 of FIGS. 4a and 4b, respectively. The first capacitor 112 fixed constant dielectric forms a first layer 400b underlying the FE dielectric 402, and a second layer 400a overlying the FE dielectric 402.

Figure 6A:
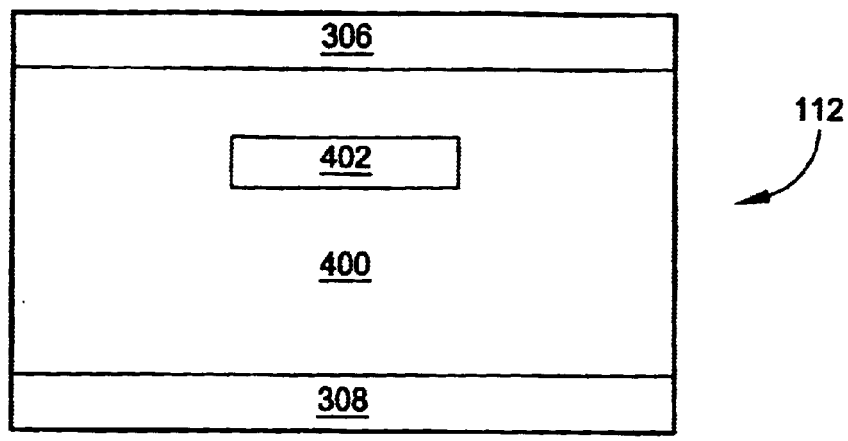
FIGS. 6a and 6b illustrate other aspects of the first capacitor of FIGS. 4a and 4b, respectively.
Figure 6B:
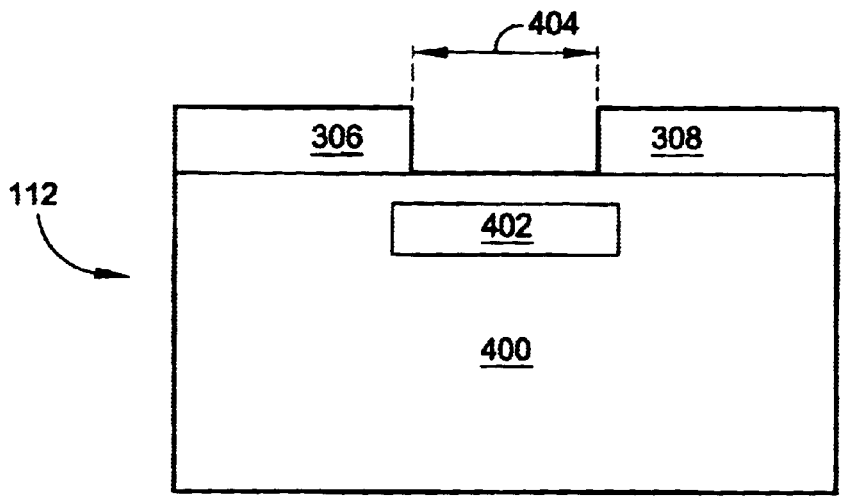

FIGS. 6a and 6b illustrate other aspects of the first capacitor 112 of FIGS. 4a and 4b, respectively. Here the ferroelectric dielectric 402 is formed internal to the fixed constant dielectric 400. Likewise but not shown, the ferroelectric dielectric 402 can be formed external to the fixed constant dielectric 400.

Returning to FIG. 3, a bias voltage blocking capacitor 310 is seen interposed between the first capacitor second terminal and the counterpoise. The blocking capacitor acts as an ac (RF) short. With respect to the PCS antenna example presented above, a 200 pf capacitance value is practical. In other aspects of the antenna, the capacitance of the blocking capacitor 310 can be reduced so that it can be used as a tuning element in series with first capacitor 112. The blocking (non-FE) capacitor has a capacitance that remains constant, while first capacitor 112 has a capacitance that varies in response to the bias voltage.

In some aspects of the invention, capacitor 310 is a second capacitor formed from a dielectric with ferroelectric material having a variable dielectric constant, equivalent to the first capacitor 112 described above. The second capacitor 310 has a first terminal 312 connected to the first capacitor second terminal 308 (the bias voltage feed 300) and a second terminal 314 connected to the counterpoise 102. The bias voltage feed 300 applies a voltage potential across the second capacitor 310. Then, the antenna 100 is resonant at a frequency responsive to the dielectric constant of the second capacitor 310 ferroelectric dielectric, in (series) combination with the first capacitor 112 ferroelectric dielectric.

Figure 7:
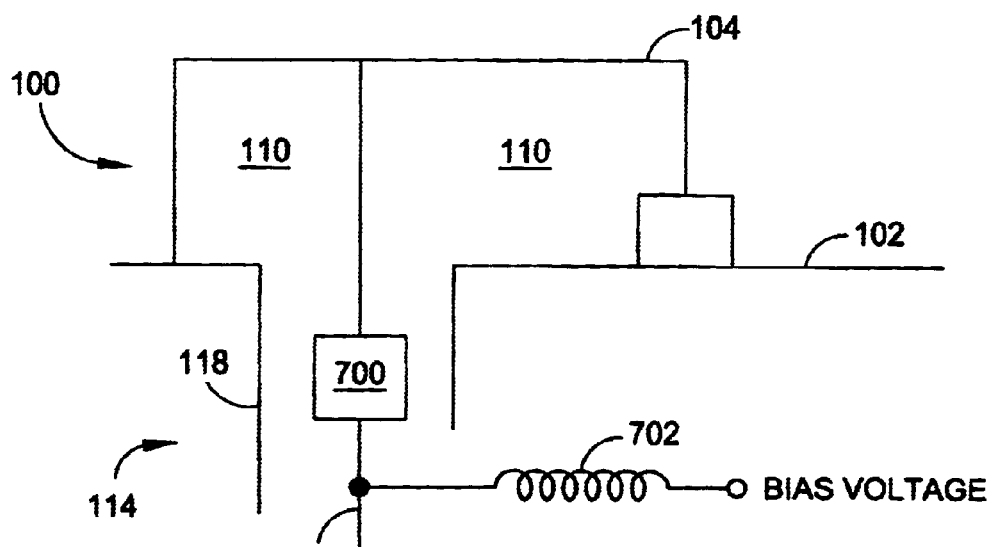
FIG. 7 is a partial cross-sectional view featuring an additional aspect of the antenna of FIG. 2.

FIG. 7 is a partial cross-sectional view featuring an additional aspect of the antenna 100 of FIG. 2. In some aspects of the antenna, when the antenna is being tuned across an extremely wide range of frequencies, it may not be practical to maintain the antenna interface 114 at a constant impedance. Then, a third FE capacitor, equivalent to the first FE capacitor 112 described above, can be used to tune the mismatch between the antenna interface 114 and the transmission line. The third capacitor 700 is formed from a ferroelectric dielectric, having a variable dielectric constant, interposed between the transmission line first polarity 116 and the radiator 104. The characteristic impedance of the transmission line 116/118 (as measured from the antenna interface 114) is responsive to the dielectric constant of the third capacitor 700 ferroelectric dielectric. The voltage bias is shown connected to the third capacitor 700 via an inductive choke 702. Alternately but not shown, a resistor can be used instead of the choke 702.

Figure 8:
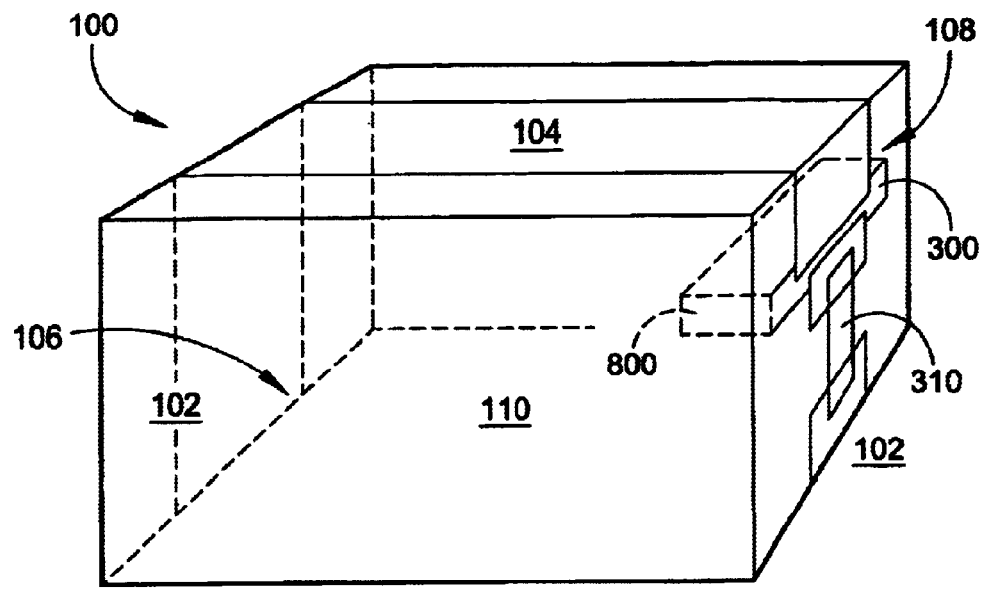
FIG. 8 is a three-dimensional perspective view of an integrated ceramic variation of the present invention inverted-F antenna.

FIG. 8 is a three-dimensional perspective view of an integrated ceramic variation of the present invention inverted-F antenna. The radiator 104 is formed as a metal inlay or metal layer overlying a ceramic block that forms the first dielectric 110. The first end 106 of the radiator 104 is connected, soldered for example, to an underlying counterpoise 102. A vias voltage feed is formed as a metal inlay or metal layer overlying the ceramic block 110, adjacent the radiator second end 108. A section of FE material 800 is embedded or formed in the first dielectric. Together, the FE material 800 and first dielectric form a first gap capacitor 112 (similar to the gap capacitor of FIG. 4b). The first capacitor terminals are formed from the second end 108 of the radiator 104 and bias voltage feed pad 300. Also shown is the bias voltage blocking capacitor 310. A resistor (not shown) can be used to supply voltage to the voltage feed 300. The transmission line feed (the transmission line first polarity as defined above in the description of FIG. 2) is not shown, but could be formed from a metal inlay or metal layer soldered to a trace underlying ceramic block 110, and running to the radiator 104. As before, the antenna 100 is resonant at a frequency responsive to the dielectric constant of the gap capacitor ferroelectric material 800.

Figure 9:
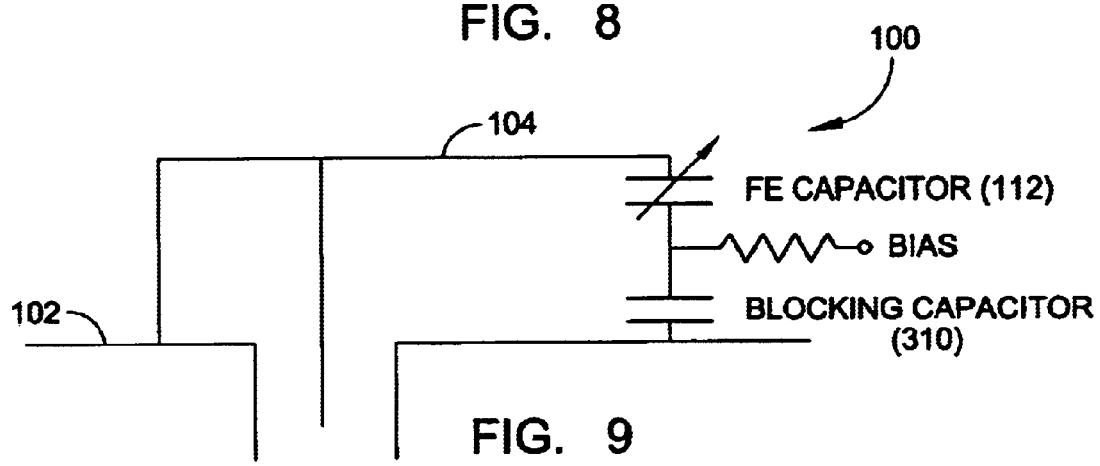
FIG. 9 is a partial schematic representation of the antennas of FIGS. 2 and 8.

FIG. 9 is a partial schematic representation of the antennas of FIGS. 2 and 8.

Figure 10:
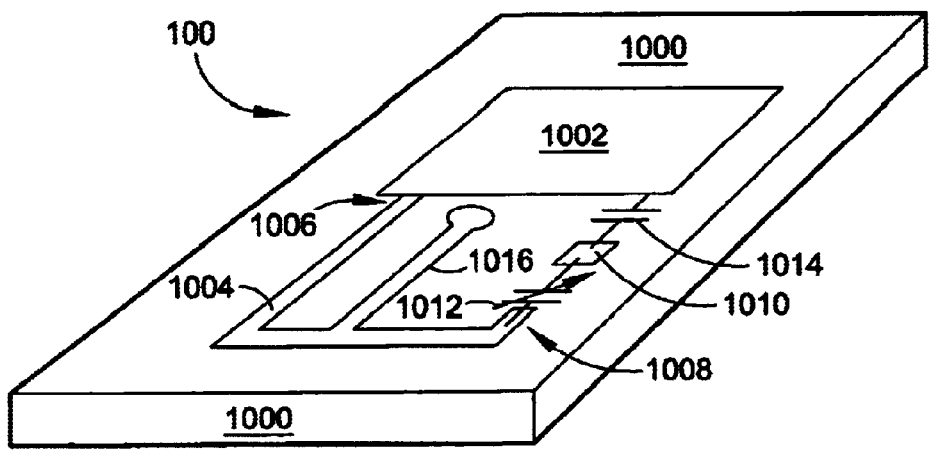
FIG. 10 is a perspective drawing of the present invention coplanar inverted-F ferroelectric antenna.

FIG. 10 is a perspective drawing of the present invention coplanar inverted-F ferroelectric antenna. The antenna 100 comprises a first dielectric layer 1000 and a counterpoise 1002 layer overlying the first dielectric layer 1000. An inverted-F shaped radiator 1004 is formed coplanar to the counterpoise layer 1002. The radiator has a first end 1006 connected to the counterpoise 1002 and a second end 1008. A bias voltage feed 1010 is located adjacent the radiator second end 1008. A first capacitor 1012, formed from ferroelectric material and having a variable dielectric constant as described above, is interposed between the radiator second end 1008 and the bias voltage feed 1010. The antenna is resonant at a frequency responsive to the dielectric constant of the first capacitor 1012 ferroelectric dielectric.

Also shown is a blocking capacitor 1014, as described above. The blocking capacitor 1014 and first capacitor 1012 are represented schematically because they can be either a lumped element parallel plate capacitor or a gap capacitor. With respect to the first capacitor 1012, the gap capacitor can be formed by embedding the ferroelectric material in the first dielectric 1000, similar to the gap capacitor shown in FIG. 8. Also shown is an RF feed line 1016, connected to an underlying transmission line with a via through the first dielectric 1000. Not shown is a resistor or choke to supply bias voltage to the bias voltage feed 1010.

An inverted-F ferroelectric antenna has been described. A few examples have been provided to illustrate how the radiator can be formed. However, the present invention is not limited to just these examples. Various FE capacitor styles and methods of locating the FE capacitors have been presented, but again the present invention can be enabled with many other variations not specifically described. Neither is the invention limited to either an integrated ceramic or lumped element design. Likewise, an example of an antenna in the context of wireless telephone communications has been presented, but the present invention antenna is not limited to any particular frequency range. Other variations and embodiments of the invention will occur to those skilled in the art.

We claim:

1. An inverted-F ferroelectric antenna comprising:
    a counterpoise;
    an inverted-F structure radiator having a first end connected to the counterpoise and a second end;
    a first dielectric interposed between the radiator and the counterpoise;
    a first capacitor formed from a dielectric with ferroelectric material, having a variable dielectric constant, interposed between the radiator second end and the counterpoise; and,
    wherein the antenna is resonant at a frequency responsive to the dielectric constant of the first capacitor ferroelectric material.

2. The antenna of claim 1 further comprising:
    a radio frequency (RF) antenna interface for connecting the radiator to a transmission line first polarity and connecting the counterpoise to the transmission line second polarity, the interface having a predetermined fixed characteristic impedance independent of the resonant frequency.

3. The antenna of claim 1 wherein the antenna has a predetermined approximately constant gain independent of the resonant frequency.

4. The antenna of claim 1 wherein the first capacitor includes:
    a dielectric formed from a material with a fixed dielectric constant; and,
    a dielectric formed from a ferroelectric material with a variable dielectric constant; and,
    wherein the antenna has a resonant frequency responsive to the variable dielectric constant of the ferroelectric material.

5. The antenna of claim 1 further comprising:
    a bias voltage feed for applying a voltage to the first capacitor; and,
    wherein the first capacitor ferroelectric dielectric has a dielectric constant that varies in response to the applied voltage.

6. The antenna of claim 5 wherein the first capacitor ferroelectric dielectric has a dielectric constant in the range between 100 and 5000 at zero volts.

7. The antenna of claim 5 wherein the first capacitor fixed constant dielectric constant and the ferroelectric dielectric have a composite dielectric constant in the range between 2 and 100 at zero volts.

8. The antenna of claim 4 wherein the first capacitor fixed constant dielectric is formed from a material selected from the group including ceramic, FR4, air, foam, MgO, lanthanum aluminate, and sapphire.

9. The antenna of claim 5 wherein the first capacitor ferroelectric dielectric is formed from barium strontium titanate, $Ba_xSr_{1-x}TiO_3$ (BSTO).

10. The antenna of claim 9 wherein the first capacitor BSTO ferroelectric material includes oxide dopants selected from the group including tungsten, manganese, and magnesium.

11. The antenna of claim 9 wherein the first capacitor ferroelectric dielectric has a dielectric constant that doubles in response to a change of less than 1 volt of bias voltage.

12. The antenna of claim 9 wherein the first capacitor has a capacitance of approximately 0.35 picofarads (pF) at zero volts of bias voltage.

13. The antenna of claim 12 wherein the first capacitor has a capacitance of approximately 0.29 pf at 40 volts of bias voltage.

14. The antenna of claim 9 wherein the first capacitor has a capacitance in the range of 0.1 to 10 pf at zero volts.

15. The antenna of claim 5 wherein the first capacitor ferroelectric dielectric is formed in a thin film having a thickness in the range from 0.15 to 2 microns.

16. The antenna of claim 5 wherein the first capacitor ferroelectric dielectric is formed in a thick film having a thickness in the range from 1.5 to 1000 microns.

17. The antenna of claim 5 wherein the first capacitor has a first terminal connected to the radiator second end and a second terminal connected to the bias voltage feed; and,
    wherein the bias voltage feed applies a first voltage potential across the first capacitor.

18. The antenna of claim 17 wherein the first capacitor includes:
    at least one fixed constant dielectric layer; and,
    a ferroelectric dielectric with a variable dielectric constant, adjacent the fixed constant dielectric.

19. The antenna of claim 18 wherein the first capacitor ferroelectric dielectric is interposed between fixed constant dielectric constant and the terminals.

20. The antenna of claim 18 wherein the first capacitor fixed constant dielectric is interposed between the ferroelectric dielectric and the terminals.

21. The antenna of claim 18 wherein the first capacitor fixed constant dielectric forms a first layer underlying the ferroelectric dielectric, and a second layer overlying the ferroelectric dielectric.

22. The antenna of claim 18 wherein the first capacitor ferroelectric dielectric is formed internal to the fixed constant dielectric.

23. The antenna of claim 18 wherein the first capacitor ferroelectric dielectric is formed external to the fixed constant dielectric.

24. The antenna of claim 17 further comprising:
a bias voltage blocking capacitor interposed between the first capacitor second terminal and the counterpoise.

25. The antenna of claim 17 wherein the first capacitor is a gap capacitor having the first and second terminals formed as pads, separated by a gap, overlying a layer of ferroelectric dielectric.

26. The antenna of claim 25 wherein the first capacitor includes the layer of ferroelectric dielectric overlying a layer of fixed constant dielectric.

27. The antenna of claim 17 wherein the first capacitor is a parallel plate capacitor having the first terminal formed as a plate, overlying a layer of ferroelectric dielectric, overlying a layer of fixed constant dielectric, overlying the second terminal formed as a plate.

28. The antenna of claim 17 further comprising:
a second capacitor formed from a dielectric with ferroelectric material having a variable dielectric constant, with a first terminal connected to the first capacitor second terminal and a second terminal connected to the counterpoise;
wherein the bias voltage feed applies a voltage potential across the second capacitor; and,
wherein the antenna is resonant at a frequency responsive to the dielectric constant of the second capacitor ferroelectric dielectric in combination with the first capacitor ferroelectric dielectric.

29. The antenna of claim 2 further comprising:
a third capacitor formed from a dielectric with ferroelectric material, having a variable dielectric constant, interposed between the transmission line first polarity and the radiator; and,
wherein the characteristic impedance of the transmission line is responsive to the dielectric constant of the third capacitor ferroelectric material.

30. The antenna of claim 1 wherein the combination of the first capacitor and the radiator have an effective electrical wavelength of a quarter-wavelength of the resonant frequency.

31. The antenna of claim 1 wherein the first dielectric is formed from a material selected from the group including ceramic, FR4, air, foam, MgO, lanthanum aluminate, and sapphire.

32. The antenna of claim 1 wherein the first capacitor includes a dielectric formed exclusively from a ferroelectric material with a variable dielectric constant; and,
wherein the antenna has a resonant frequency responsive to the variable dielectric constant of the ferroelectric material.

33. An integrated ceramic inverted-F ferroelectric antenna comprising:
a counterpoise;
a ceramic block overlying the counterpoise;
an inverted-F structure radiator formed as a metal inlay in the ceramic block, having a first end connected to the counterpoise and a second end;
a bias voltage feed metal inlay in the ceramic block adjacent the radiator second end;
a gap capacitor formed from ferroelectric material, having a variable dielectric constant, embedded in the ceramic block, a first terminal formed from the radiator second end, and a second terminal formed from the bias voltage feed; and,
wherein the antenna is resonant at a frequency responsive to the dielectric constant of the gap capacitor ferroelectric material.

34. A coplanar inverted-F ferroelectric antenna comprising:
a first dielectric layer;
a counterpoise layer overlying the first dielectric layer;
an inverted-F shaped radiator formed coplanar to the counterpoise layer, having a first end connected to the counterpoise and a second end;
a bias voltage feed adjacent the radiator second end;
a first capacitor formed from ferroelectric material, having a variable dielectric constant, interposed between the radiator second end and the bias voltage feed; and,
wherein the antenna is resonant at a frequency responsive to the dielectric constant of the first capacitor ferroelectric dielectric.

35. The antenna of claim 34 wherein the first capacitor is selected from the group including a parallel plate capacitor and gap capacitor formed from embedding the ferroelectric material in the first dielectric.

* * * * *

UNITED STATES PATENT AND TRADEMARK OFFICE
Certificate

Patent No. 6,885,341 B2                                                                                Patented: April 26, 2005

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Allen Tran, San Diego, CA (US); Jordi Fabrega-Sanchez, San Diego, CA (US); and Stanley S. Toncich, San Diego, CA (US).

Signed and Sealed this Thirteenth Day of November 2012.

JACOB Y. CHOI
*Supervisory Patent Examiner*
Art Unit 2821
Technology Center 2800